(12) United States Patent
Schulze et al.

(10) Patent No.: US 11,965,916 B2
(45) Date of Patent: Apr. 23, 2024

(54) METHOD AND DEVICE FOR DETERMINING THE RESISTIVE COMPONENT OF THE LEAKAGE CURRENT IMPEDANCE IN THE ALTERNATING CURRENT NETWORK

(71) Applicant: Safetytest GmbH, Hirschaid (DE)

(72) Inventors: Simon Schulze, Nuremberg (DE);
Wolfgang Schulze, Nuremberg (DE);
Dimitar Vergov, Nuremberg (DE)

(73) Assignee: Safetytest GmbH, Hirschaid (DE)

( * ) Notice: Subject to any disclaimer, the term of this patent is extended or adjusted under 35 U.S.C. 154(b) by 101 days.

(21) Appl. No.: 17/769,142

(22) PCT Filed: Oct. 15, 2020

(86) PCT No.: PCT/EP2020/079116
§ 371 (c)(1),
(2) Date: Apr. 14, 2022

(87) PCT Pub. No.: WO2021/074333
PCT Pub. Date: Apr. 22, 2021

(65) Prior Publication Data
US 2023/0160933 A1 May 25, 2023

(30) Foreign Application Priority Data
Oct. 17, 2019 (DE) .......................... 102019007224.3

(51) Int. Cl.
*G01R 19/10* (2006.01)
*G01R 27/02* (2006.01)
*G01R 27/18* (2006.01)

(52) U.S. Cl.
CPC ........... *G01R 19/10* (2013.01); *G01R 27/025* (2013.01); *G01R 27/18* (2013.01)

(58) Field of Classification Search
CPC ...... G01R 19/10; G01R 27/025; G01R 27/18; G01R 1/04; G01R 11/50; G01R 19/165; G01R 23/12; H02H 3/162
(Continued)

(56) References Cited

U.S. PATENT DOCUMENTS 6,421,618 B1 * 7/2002 Kliman ................ G01R 31/346
702/57
9,110,117 B2 * 8/2015 Werelius ................ G01R 31/14
(Continued)

FOREIGN PATENT DOCUMENTS

DE    19826410    1/1999
DE    10355086    6/2005
(Continued)

*Primary Examiner* — Christopher P McAndrew
(74) *Attorney, Agent, or Firm* — DeLio Peterson & Curcio LLC; Robert Curcio (57) ABSTRACT

A method for determining the resistive component of the leakage current impedance ($R_{i50}$) of a downstream branch to an alternating current network having a live phase (L), a neutral conductor (N), and a protective conductor (PE) conducted by: (a) measuring a differential current $I_{LN}$ between the live phase (L) and the neutral conductor (N); (b) measuring a voltage U between the live phase (L) and the neutral conductor (N) or between the live phase (L) and the protective conductor (PE); (c) correcting a phase shift between the differential current $I_{LN}$ and the voltage U; (d) determining several individual differential current values $I_{LN,i}$ and several individual voltage values $U_i$, the differential current values $I_{LN,i}$ being phase-corrected with respect to the voltage values $U_i$; (e) determining the effective power P from the several individual differential current values $I_{LN,I}$ and the several individual voltage values $U_i$; (f) determining the effective voltage $U_{Eff}$ by the voltage values $U_i$; and (g) determining the resistive component of the leakage current impedance ($R_{i50}$).

15 Claims, 5 Drawing Sheets

(58) Field of Classification Search
USPC .......................................................... 324/509
See application file for complete search history.

(56) References Cited

U.S. PATENT DOCUMENTS

| | | | | |
|---|---|---|---|---|
| 9,857,408 | B2* | 1/2018 | Machida | ................ H02H 1/003 |
| 2003/0112015 | A1 | 6/2003 | Takakamo | |
| 2007/0063711 | A1* | 3/2007 | Smithson | ............... G01R 27/18 |
| | | | | 324/620 |
| 2017/0350927 | A1* | 12/2017 | Gabrielsson | ........... G01R 27/18 |
| 2018/0261072 | A1* | 9/2018 | Frackelton | ........... G08B 21/185 |

FOREIGN PATENT DOCUMENTS

| | | |
|---|---|---|
| DE | 102015218911 | 1/2017 |
| EP | 2571128 | 3/2013 |
| EP | 3136115 | 3/2017 |

\* cited by examiner

METHOD AND DEVICE FOR DETERMINING THE RESISTIVE COMPONENT OF THE LEAKAGE CURRENT IMPEDANCE IN THE ALTERNATING CURRENT NETWORK

BACKGROUND OF THE INVENTION

1. Field of the Invention

The invention relates to a method and a device for determining the resistive component of the leakage current impedance in the alternating current network.

2. Description of Related Art

To prevent personal injury from electrical accidents, it is necessary to perform an inspection of electrical devices and facilities with regard to insulation resistance and fault current. The evaluation of the insulation resistance $R_{iSO}$ between the active conductors (phase L and neutral conductor N) and the protective conductor PE in an alternating current network and/or a consumer connected to it is an important quality and safety feature. The inspection of the insulation resistance $R_{iSO}$ is prescribed in many standards. Limit values for the insulation resistance $R_{iSO}$ are usually higher than 1 MOhm (MΩ).

However, the insulation resistance $R_{iSO}$ can only be measured directly without network voltage. As a result, the insulation of parts that are arranged behind switches or contactors separating all poles cannot be detected. As an alternative to directly measuring the insulation resistance $R_{iSO}$, the differential current measurement method is used during operation, which determines the differential current between the phase L and the neutral conductor N. This differential current essentially corresponds to the leakage current between the active conductors (phase L and neutral conductor N) and the protective conductor PE when the alternating current network is switched on. Due to system-related capacitive filter elements built into the alternating current network and/or the consumer, usually for electromagnetic compatibility (EMC) reasons, the limit values in the standards for the maximum permissible differential current are relatively high, e.g., 3.5 mA, which corresponds to an alternating current impedance in a 230 V network of only 66 kOhm (kΩ). A high differential current leads to a high risk. At 3.5 mA one is far from a high impedance. It can be seen from this that insulation resistances $R_{iSO}$, which are an indicator of soiling or aging of a consumer, cannot be detected above 1 MOhm. This limits the test accuracy when determining the insulation resistance $R_{iSO}$ via determining the pure differential current.

DE 198 26 410 A1 describes a method and a device for insulation and fault current monitoring in an alternating current network. Here, the differential current between at least two network conductors is detected. The alternating current component of the differential current is detected as a first network variable and the alternating network voltage between at least two network conductors or between a network conductor and a protective conductor or a neutral conductor is detected as a second network variable. The product between the amplitude of the alternating current component of the differential current and the cosine of the phase angle Θ between the two network variables detected is a measure of the resistive fault current. The load cut-off is carried out when the determined product exceeds a certain response value. However, the provision proposed in DE 198 26 410 A1 for the resistive fault current only applies to sinusoidal voltages and currents.

U.S. Pat. No. 6,922,643 B2 likewise shows a method and a device for determining a fault current in an alternating current network.

DE 103 55 086 A1 describes a method for determining the ohmic insulation resistance of a grounded, single-phase or multi-phase, operational and working alternating current network, in which in particular the differential current is measured and evaluated.

SUMMARY OF THE INVENTION

The invention is based on the object of providing a method in which the insulation and fault current monitoring can be improved. It is also an object of the invention to provide a device in which the insulation and fault current monitoring can be improved.

This object is achieved by the subject matter of the independent claims. Advantageous embodiments of the method according to the invention are the subject matter of the dependent claims and emerge from the following description of the invention. A device according to the invention is further described in the claims.

Accordingly, a method for determining the resistive component of the leakage current impedance of a downstream branch to an alternating current network having a phase, a neutral conductor and a protective conductor is described. The method includes the following steps:

measuring by scanning a differential current $I_{LN}$ between the phase and the neutral conductor by means of a differential current sensor;

measuring by scanning a voltage U between the phase and the neutral conductor or between the phase and the protective conductor;

correcting a phase shift between the differential current $I_{LN}$ and the voltage U;

determining several individual differential current values $I_{LN,i}$ and several individual voltage values $U_i$, wherein the differential current values $I_{LN,i}$ are phase-corrected with respect to the voltage values $U_i$;

determining the effective power P from the several individual differential current values $I_{LN,i}$ and the several individual voltage values $U_i$;

determining the effective voltage $U_{Eff}$ by means of the voltage values $U_i$; and determining the resistive component of the leakage current impedance by means of the effective voltage $U_{Eff}$ and the effective power P.

The present invention is further directed to a device adapted for determining the resistive component of the leakage current impedance (R) of a downstream branch to an alternating current network having a phase (L), a neutral conductor (N), and a protective conductor (PE) by a method according to claim 1, comprising: a voltage sensor adapted for measuring by scanning a voltage (U) between the phase (L) and the neutral conductor (N), or between the phase (L) and the protective conductor (PE), a differential current sensor adapted for measuring by scanning a differential current $I_{LN}$ between the phase (L) and the neutral conductor (N), and an evaluation unit adapted for correcting a phase shift between the differential current $I_{LN}$ and the voltage (U), adapted for determining several individual differential current values $I_{LN,i}$ and several individual voltage values $U_i$, wherein the differential current values $I_{LN,i}$ are phase-corrected with respect to the voltage values adapted for determining the effective power P from the several individual differential current values $I_{LN,i}$ and the several individual voltage values $U_i$, adapted for determining the effective voltage $U_{Eff}$ by the voltage values and adapted for determining the resistive component of the leakage current impedance ($R_{iso}$) by the effective voltage $U_{Eff}$ and the effective power P.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-5 of the drawings in which like numerals refer to like features of the invention.

Measuring the differential current $I_{LN}$ and the voltage U by scanning leads to the digital detection of the effective power of the leakage current. Thereby, the resistive component of the leakage current impedance can be determined for non-sinusoidal network voltages and non-sinusoidal currents.

While measuring by scanning the differential current $I_{LN}$, individual differential current scanning values are measured at a predetermined time interval from one another and while measuring by scanning the voltage U, individual voltage scanning values are measured at a predetermined time interval from one another.

The voltage U is measured by scanning between the phase and the neutral conductor, i.e., a voltage $U_{LN}$ is measured. Alternatively, the voltage U is measured by scanning between the phase and the protective conductor, i.e., a voltage $U_{LPE}$ is measured.

The correction of the phase shift is preferably done digitally.

According to one embodiment of the method, the alternating current network is a TN alternating current network. Alternatively, the alternating current network could also be a TT alternating current network or an IT alternating current network.

According to a further embodiment of the method, for adjusting a device for determining the resistive component of the leakage current impedance, first a value for correcting the phase shift is determined by connecting a downstream branch having a purely capacitive load, a purely inductive load, or a purely resistive load to the alternating current network. Then, a voltage U and a differential current $I_{LN}$ are determined with this downstream branch. Advantageously, with such a downstream branch having a purely capacitive load, a purely inductive load, or a purely resistive load, a value for the phase shift can be determined, which can be used in a later measurement for correction on the downstream branch to be measured.

According to a further embodiment of the method, individual differential current scanning values are measured when measuring by scanning a differential current $I_{LN}$. Individual voltage scanning values are measured when measuring by scanning a voltage U. Further, a temporal differential current curve is obtained from an interpolation of the differential current scanning values, and a temporal voltage curve is obtained from an interpolation of the voltage scanning values in order to improve the correction of the phase shift between the differential current $I_{LN}$ and the voltage U. Advantageously, the phase shift can be determined precisely by means of the interpolation of the differential current samples and the interpolation of the voltage samples.

According to a further embodiment of the method, the differential current sensor includes a compensation conductor when measuring by scanning the differential current $I_{LN}$. Thereby, an error of the differential current sensor is compensated by means of the compensation conductor. For this purpose, the compensation conductor, the phase and the neutral conductor are passed through a core of the compensation conductor. The compensation conductor can be used to compensate for the fact that the phase and the neutral conductor are not passed through the core exactly symmetrically. The compensation conductor therefore compensates for the asymmetry of the unit consisting of core, phase, and neutral conductor. For this purpose, a compensation current, which can be proportional to the current flowing through the phase, is sent through the compensation conductor.

According to a further embodiment of the method, the current flowing through the compensation conductor is proportional to the current flowing through the phase or the neutral conductor. Therefore, the compensation circuit, which causes the current flow through the compensation conductor, can be constructed simply. The current that flows through the phase or the neutral conductor is then only provided with a constant factor.

According to a further embodiment of the method, an error of the differential current sensor is compensated by calculating a factor Kp from the measured variable current of the phase and/or from the measured variable current of the neutral conductor, and by deducting a value $Kp*I_{LN,i}$ for each measured differential current value $I_{LN,i}$. Therefore, the compensation of the error of the differential current sensor is done digitally. Preferably, either the measured variable current of the phase or the measured variable current of the neutral conductor and the differential current $I_{LN}$ are detected. The differential current $I_{LN}$ is then corrected digitally by means of the current of the phase (or the current of the neutral conductor). A factor Kp is calculated from the measured variable current of the phase (or the measured variable current of the neutral conductor). A value $Kp*I_{LN,i}$ is then deducted for each measured differential current value $I_{LN,i}$.

According to a further embodiment of the method, the alternating current network is switched off and/or a message is sent to a higher-level system, if the resistive component of the leakage current impedance falls below a predetermined value. The lower the resistive component of the leakage current impedance, the higher the leakage current can be. Since a high leakage current can be dangerous, too low a resistive component of the leakage current impedance is not desired. Therefore, the alternating current network can be switched off, if the resistive component of the leakage current impedance is too low. In this context, "switched off" can mean that the alternating current network is switched off or that the alternating current network is completely disconnected on all poles from the downstream branch.

The higher-level system is to be understood as meaning, for example, a cloud system or a monitoring system. The cloud system is a system that can be accessed via the Internet. The monitoring system is a local system that is suitable for monitoring individual parameters.

As an alternative or in addition to the resistive component of the leakage current impedance, a further network parameter can also be monitored. If the further network parameter detected is exceeded or not reached, a message can be sent to the higher-level system and/or the alternating current network can be switched off. The further network parameter can be the differential current $I_{LN}$, for example.

Furthermore, a device for determining the resistive component of the leakage current impedance of a downstream branch to an alternating current network having a phase, a neutral conductor, and a protective conductor is provided. The device comprises the following components: a voltage sensor for measuring by scanning a voltage U between the phase and the neutral conductor or between the phase and the protective conductor; a differential current sensor for measuring by scanning a differential current $I_{LN}$ between the phase and the neutral conductor; and an evaluation unit for correcting a phase shift between the differential current $I_{LN}$ and the voltage U, for determining several individual differential current values $I_{LN,i}$ and several individual voltage values wherein the differential current values $I_{LN,i}$ are phase-corrected with respect to the voltage values $U_i$, for determining the effective power P from the several individual differential current values $I_{LN,i}$ and the several individual voltage values for determining the effective voltage $U_{Eff}$ by means of the voltage values and for determining the resistive component of the leakage current impedance by means of the effective voltage $U_{Eff}$ and the effective power P.

Advantageously, the device described is suitable for performing the method described.

According to one embodiment of the device, the differential current sensor includes a core and a compensation conductor. Here, the phase, the neutral conductor, and the compensation conductor are passed through the core. Due to the non-symmetrical arrangement of phase and neutral conductor in relation to the core, there may be a symmetry error in the differential current measurement. This symmetry error can be compensated by means of the compensation conductor. Thus, the compensation conductor compensates the asymmetry of the unit consisting of core, phase and neutral conductor. For this purpose, a compensation current, which can be proportional to the current flowing through the phase, is sent through the compensation conductor.

Alternatively, the error of the differential current sensor can also be compensated digitally. A compensation conductor is not required in this case.

According to a further embodiment of the device, the device includes a monitoring system which is connected to the evaluation unit in order to monitor the resistive component of the leakage current impedance. The monitoring system can display the resistive component of the leakage current impedance so that a user can make a decision as to whether the alternating current network should be switched off. As an alternative or in addition, the monitoring system can also electronically inspect the resistive component of the leakage current impedance and independently make a decision as to whether the alternating current network should be switched off.

In addition, the device can alternatively or additionally forward the measurement data to a cloud system for analysis and processing.

Further, a distribution cabinet comprising at least one device, as described above, is provided. One or more devices can be installed, clamped or plugged into the distribution cabinet very easily.

The at least one device detects the network parameters differential current $I_{LN}$, voltage U and insulation resistance, i.e., the resistive component of the leakage current impedance $R_{i50}$. Here, further network parameters can be detected by the distribution cabinet. Such network parameters are, for example, the effective power of a consumer and the current of a consumer. The distribution cabinet can also include an energy meter. In addition, a current measurement of the neutral conductor by means of a harmonic analysis and an energy analysis can provide information about arcing faults.

According to one embodiment of the distribution cabinet, the at least one device is designed as a terminal block. Here, the terminal block can be a flat terminal block. Several terminal blocks can be lined up in larger numbers on a mounting rail. For this purpose, the distribution cabinet can include a mounting rail. The terminal block can be used, among other things, for the detachable connection or the connection of wires, strands and lines within the distribution cabinet.

According to a further embodiment of the distribution cabinet, the distribution cabinet includes at least one further device. In this case, measured values of the at least one device are exchanged with the at least one further device. The distribution cabinet is advantageously suitable for enabling the exchange of measured values between the devices. Advantageously the same measurements do not have to be performed again in each device then.

The embodiments and features described for the proposed method apply accordingly to the proposed device and the proposed distribution cabinet and vice versa.

Further possible implementations of the invention also comprise combinations of features described above or below that are not explicitly mentioned. Individual aspects can also be added as improvements or additions to the respective basic form of the invention.

Identical or functionally identical elements have been provided with the same reference signs in the figures. It should further be noted that the representations in the figures are not necessarily to scale.

Figure 1:
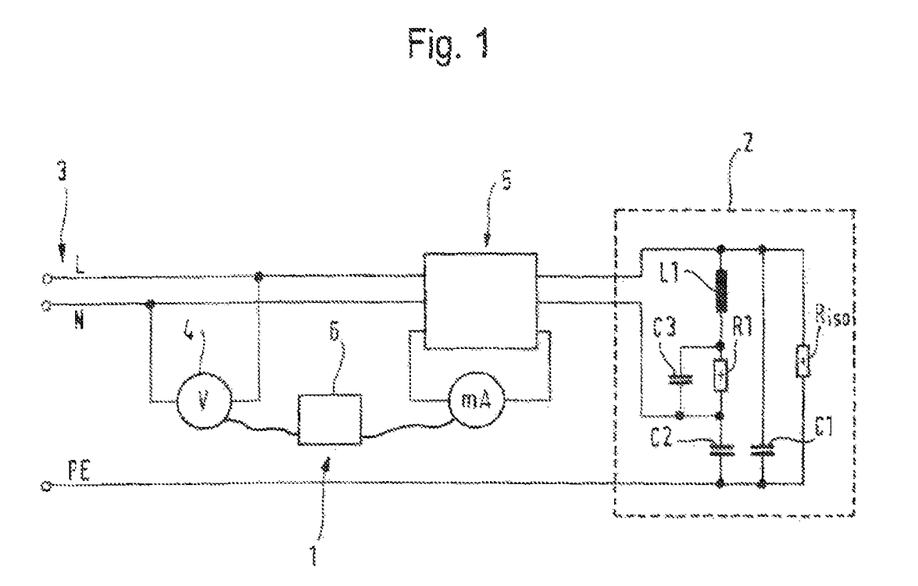
FIG. 1 a schematic view of a device for determining the resistive component of the leakage current impedance of a downstream branch to a TN alternating current network.

FIG. 1 shows a schematic view of a device 1 for determining the resistive component of the leakage current impedance $R_{i50}$ of a downstream branch 2 to a TN alternating current network 3. The TN alternating current network 3 has a phase L, a neutral conductor N and a protective conductor PE.

The device 1 comprises a voltage sensor 4, a differential current sensor 5, and an evaluation unit 6. The voltage sensor 4 measures the voltage $U_{LN}$ between the phase L and the neutral conductor N. Alternatively, the voltage sensor 4 could also measure a voltage $U_{LPE}$ between the phase L and the protective conductor PE.

The active conductors phase L and neutral conductor N are passed through the differential current sensor 5. The differential current sensor 5 adds up the currents of phase L and of the neutral conductor N. If no leakage current flows, the sum is zero. When leakage current is present, a part of the current does not flow back through the neutral conductor N. Accordingly, a differential current $I_{LN}$ between phase L and neutral conductor N is measured.

The evaluation unit 6 is used to correct the phase shift between the differential current $I_{LN}$ and the voltage $U_{LN}$, for determining several individual differential current values $I_{LN,i}$ and several individual voltage values $U_{LN,i}$, wherein the differential current values $I_{LN,i}$ are phase-corrected with respect to the voltage values $U_{LN,i}$ for determining the effective power P from the several individual differential current values $I_{LN,i}$ and the several individual voltage values $U_{LN,i}$, for determining the effective voltage $U_{Eff}$ by means of the voltage values $U_{LN,i}$, and for determining the resistive component of the leakage current impedance $R_{i50}$ by means of the effective voltage $U_{Eff}$ and the effective power P.

If the resistive component of the leakage current impedance $R_{i50}$ is less than a limit value, for example, 1 MOhm, then the downstream branch 2 can be disconnected from the TN alternating current network 3 on all poles (completely) by means of a switch (not shown in FIG. 1).

The downstream branch 2 includes a first branch having the resistance $R_{i50}$. This first branch results in a purely resistive leakage current. The downstream branch 2 also includes a second branch having a capacitance C1. This second branch results in a purely capacitive leakage current. The downstream branch 2 also includes a third branch having an inductance L1, a resistance R1, a capacitance C3, and a capacitance C2. This third branch results in a leakage current where the resistance R1 generates a resistive component. However, this current would not be detected in a direct current insulation resistance measurement since it is decoupled via the capacitance C2 in a direct current measurement method. This example shows that the AC measurement method can specify resistive values, which, however, would not generate a lower insulation resistance value in direct current measurement methods.

By detecting the resistive component of the leakage current impedance $R_{i50}$ of the downstream branch 2 to the TN alternating current network 3, it is possible to evaluate the insulation of the downstream branch 2 in the operating state. The measurement results are falsified by resistive components that are present in series with capacitive components. These are also measured, but not taken into account when determining the insulation resistance. Resistive components (see resistance R1) in series with capacitances (see capacitance C2), which significantly influence the result of a typical insulation resistance limit value of 1 MOhm, are, however, uncommon.

The device 1 can include a monitoring system (not shown in FIG. 1) which is connected to the evaluation unit 6. The resistive component of the leakage current impedance $R_{i50}$ can be monitored by means of the monitoring system. That is to say, manual and/or machine monitoring of the resistive component of the leakage current impedance $R_{i50}$ is possible by means of the monitoring system.

Further, a distribution cabinet can include several devices 1. Here, the devices 1 can in particular be designed as terminal blocks. In addition, an individual device can be designed in such a way that it exchanges individual measured values with another device 1, i.e., a measured value from one device 1 is transmitted to another device 1.

Figure 2:
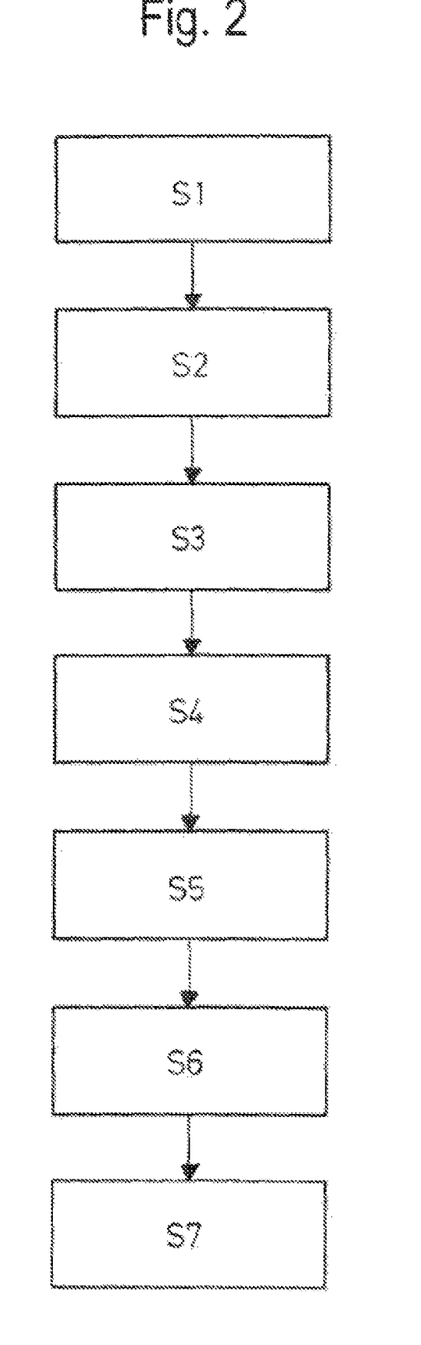
FIG. 2 a flow chart of a method for determining the resistive component of the leakage current impedance of a downstream branch to a TN alternating current network.

FIG. 2 shows a flow chart of a method for determining the resistive component of the leakage current impedance $R_{i50}$ of a downstream branch 2 to a TN alternating current network 3.

In a first optional step S1, a downstream branch having a purely capacitive load is connected to the TN alternating current network 3. Then, a voltage $U_{LN}$ is measured between the phase L and the neutral conductor N. Further, a differential current $I_{LN}$ is measured between the phase L and the neutral conductor N. By comparing the phase curve of the voltage $U_{LN}$ with the phase curve of the differential current N, a value for the phase shift of the voltage $U_{LN}$ to the differential current $I_{LN}$ can be determined. Alternatively, a downstream branch having a purely inductive load or a purely resistive load could also be connected. Other adjustment options, for example, with the help of a 2-channel oscilloscope, would also be conceivable.

In a second step S2, instead of the downstream branch having a purely capacitive load, the downstream branch 2 to be measured is connected to the TN alternating current network 3. Further, a voltage $U_{LN}$ is measured between the phase L and the neutral conductor N. In addition, a differential current $I_{LN}$ between the phase L and the neutral conductor N is measured by means of a differential current sensor 5. Here, both the voltage $U_{LN}$ and the differential current $I_{LN}$ are measured by scanning. Accordingly, a digitised voltage curve and a digitised differential current curve are obtained.

Figure 3:
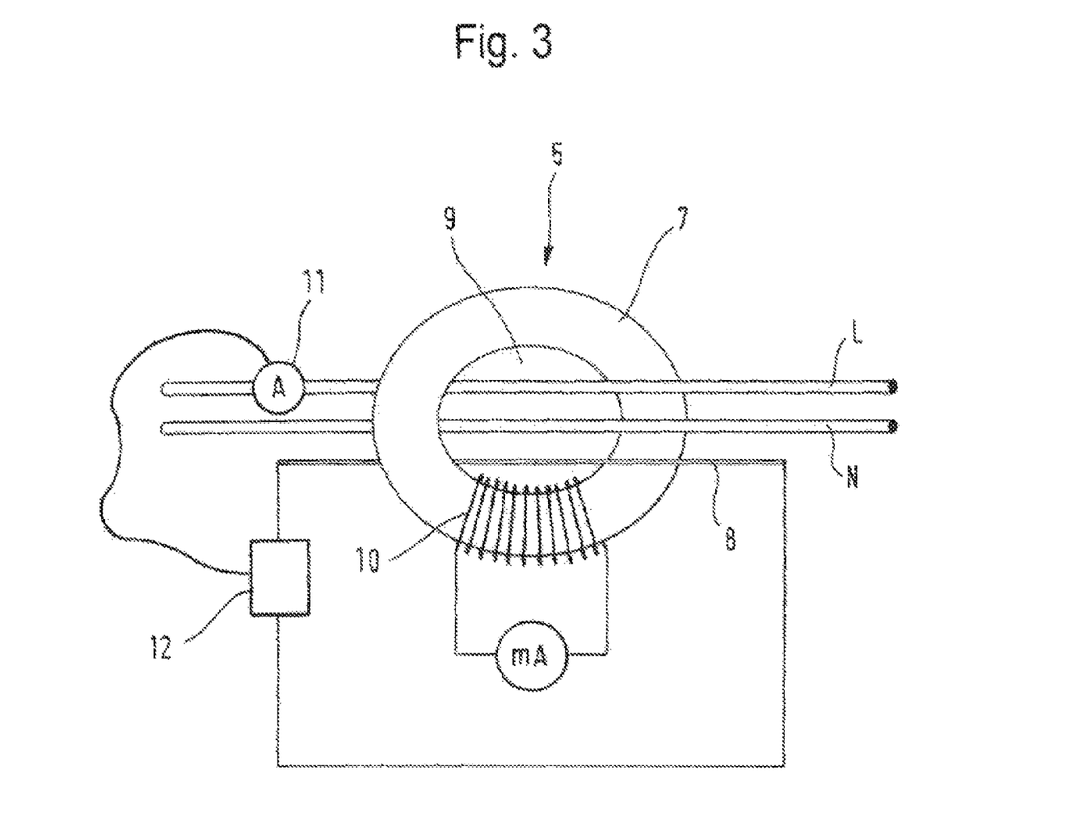
FIG. 3 a schematic view of the differential current sensor represented in FIG. 1.
Figure 4:
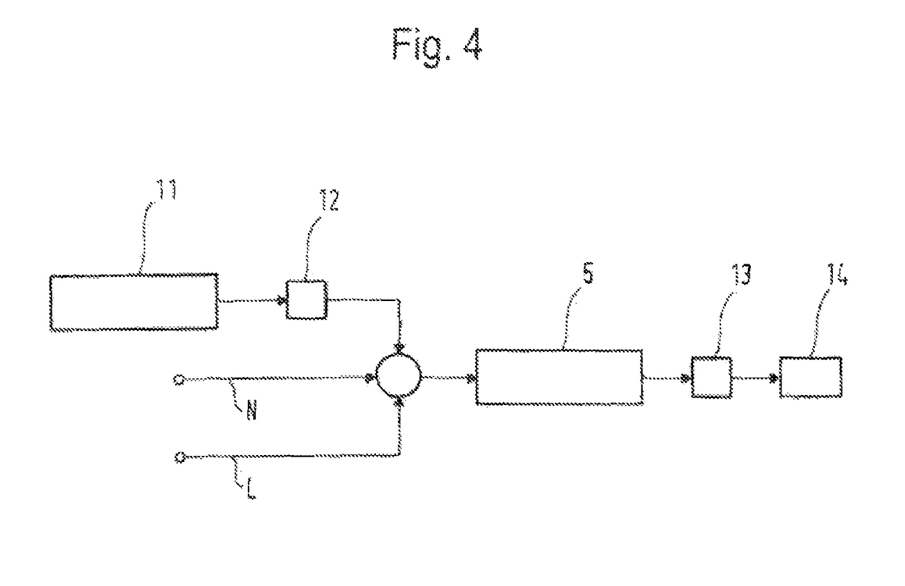
FIG. 4 a block diagram of the differential current sensor represented in FIG. 3.
Figure 5:
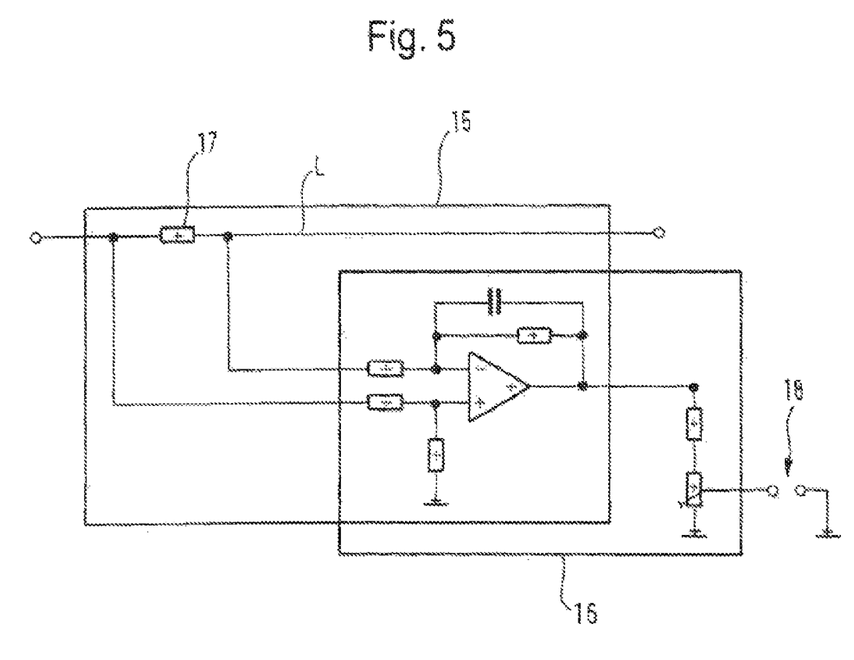
FIG. 5 a circuit diagram for controlling the compensation conductor of the differential current sensor represented in FIG. 3.

The differential current $I_{LN}$ can be measured, for example, with a differential current sensor 5, as described in FIGS. 3 to 5.

In a third step S3, the phase shift between the differential current $I_{LN}$ determined in the second step and the voltage $U_{LN}$ determined in the second step is corrected. This is done, for example, by correcting the phase of the differential current $I_{LN}$ determined in the second step by the value for the phase shift determined in the first step. This correction is preferably performed digitally.

In a fourth step S4, several individual differential current values $I_{LN,i}$ and several individual voltage values $U_{LN,i}$ are determined. The differential current values $I_{LN,i}$ are already phase-corrected with respect to the voltage values $U_{LN,i}$, as described above. In total, a number of n values in each case is determined.

In a fifth step S5, the effective power P is determined. In principle, the effective power is calculated using the following formula:

$$P = \frac{1}{T} \int_{t_0}^{t_0+T} U_{LN} * I_{LN} dt$$

Here, T is the period duration of a network cycle. In particular, at least a quarter period is used as the integration time. Integration is preferably performed over one network cycle or over several network cycles. In the present case, the effective power P is determined from the several individual residual current values $I_{LN,i}$ and the several individual voltage values $U_{LN,i}$ using the following formula:

$$P = \frac{1}{n} \sum_{i=1}^{n} U_{LN,i} * I_{LN,i}$$

In a sixth step S6, the effective voltage $U_{Eff}$ is determined by means of the voltage values $U_{LN,i}$ using the following formula:

$$U_{Eff} = \sqrt{\frac{1}{n} \sum_{i=1}^{n} U_{LN,i}^2}$$

In a seventh step S7, the resistive component of the leakage current impedance $R_{iso}$ is determined by means of the effective voltage $U_{Eff}$ and the effective power P using the following formula:

$$R_{iso} = \frac{U_{Eff}^2}{P}$$

Here, the resistive component of the leakage current impedance $R_{iso}$ essentially corresponds to the insulation resistance of the downstream branch 2 and is therefore a measure of the quality of the insulation of the downstream branch 2.

In a further step, the TN alternating current network 3 can be switched off if the resistive component of the leakage current impedance $R_{iso}$ falls below a predetermined value.

The correction of the phase shift between the differential current $I_{LN}$ and the voltage $U_{LN}$ can be improved by determining a voltage curve from the individual voltage scanning values by means of interpolation and by determining a differential current curve from the individual differential current scanning values by means of interpolation. The phase shift of the curves determined in this way can be better determined.

The TN alternating current network 3 shown in FIG. 1 has a phase L. Alternatively, a TN alternating current network 3 can also have two or three phases L. In this case, the resistive component of the leakage current impedance $R_{iso}$ can be determined separately for each phase L.

FIG. 3 shows a schematic view of the differential current sensor 5 represented in FIG. 1. The differential current sensor 5 includes a core 7 and a compensation conductor 8. The phase L, the neutral conductor N and the compensation conductor 8 are passed through the core 7. In particular, the phase L, the neutral conductor N and the compensation conductor 8 can each be wound several times around the core 7. The core 7 can be designed as a closed, in particular circular structure with a through opening 9. The differential current $I_{LN}$ can be detected by means of a measuring winding 10.

An error of the differential current sensor 5 can be compensated by means of the compensation conductor 8. The error results from the imperfect symmetry of the phase L and the neutral conductor N with respect to the core 7. This asymmetry error can be compensated by means of a current through the compensation conductor 8.

Further, the differential current sensor 5 can include an ammeter 11 and a control unit 12. The current intensity measured by the ammeter 11 is in particular in a range from 0 to 20 A. However, the current intensity can also be higher than 20 A. A current signal of the phase L is measured by means of the ammeter 11. The ammeter 11 is connected to the control unit 12 so that the control unit 12 can further process the current signal. The control unit 12 controls the current flow through the compensation conductor 8 to compensate the asymmetry error.

In particular, the current flowing through the compensation conductor 8 can be proportional to the current flowing through the phase L.

Alternatively, the current of the neutral conductor N could also be measured by means of an ammeter 11 in order to compensate the asymmetry error.

Further, the compensation of the asymmetry error can alternatively also be performed digitally, as will be described further below.

FIG. 4 shows a block diagram of the differential current sensor 5 represented in FIG. 3. The current which is measured by means of the ammeter 11 can be fed into the differential current sensor 5 via the control unit 12 and the compensation line 8 together with the phase L and the neutral conductor N. The measured differential current $I_{LN}$ can be forwarded via an amplifier circuit 13 and an analogue-digital converter 14.

Due to the asymmetrical structure of the differential current sensor 5, an error occurs which is linearly proportional to the current flowing in the circuit. The linear error can be compensated analogously by the appropriately amplified feedback of the current signal of the ammeter 11 in the sensor circuit by means of the compensation line 8.

FIG. 5 shows a circuit diagram for controlling the compensation conductor 8 of the differential current sensor 5 represented in FIG. 3. Phase L, the circuit diagram, the circuit diagram 15 for the ammeter 11, the circuit diagram 16 for the control unit 12, the shunt 17 for the current measurement of the ammeter 11 and the connections 18 for the compensation conductor 8 are represented. By means of an amplification circuit and a voltage divider, the current signal of the ammeter 11 is appropriately amplified for the compensation. The connections 18 are connected to the compensation conductor 8.

Instead of the phase L, the current can alternatively also be measured at the neutral conductor N, since the phase L and the neutral conductor N form the consumer circuit.

Alternatively, the compensation for the asymmetry error of the differential current sensor 5 can also be implemented digitally. For this purpose, the measured variables current of phase L (or current of neutral conductor N) and the differential current $I_{LN}$ are detected. The differential current $I_{LN}$ is then corrected digitally by means of the current of the phase L. For example, a factor Kp is calculated from the measured variable current of phase L. A value $Kp*I_{LN,i}$ is deducted for each measured differential current value $I_{LN,i}$.

LIST OF REFERENCE SIGNS

1 Device
2 Downstream branch
3 TN alternating current network
4 Voltage sensor
5 Differential current sensor
6 Evaluation unit
7 Core
8 Compensation conductor
9 Through opening
10 Measuring winding
11 Ammeter
12 Control unit
13 Amplifier circuit
14 Analogue-digital converter
15 Circuit diagram
16 Circuit diagram
17 Shunt
18 Connections
L Phase
N Neutral conductor
PE Protective conductor
$R_{iso}$ Resistive component of the leakage current impedance While the present invention has been particularly described, in conjunction with a specific preferred embodiment, it is evident that many alternatives, modifications and variations will be apparent to those skilled in the art in light Thus, having described the invention, what is claimed is:

1. A method for determining the resistive component of the leakage current impedance ($R_{iso}$) of a downstream branch to an alternating current network having a phase (L), a neutral conductor and a protective conductor (PE), comprising the steps of:
   measuring by scanning a differential current $I_{LN}$ between the phase (L) and the neutral conductor (N) using a differential current sensor;
   measuring by scanning a voltage (U) between the phase (L) and the neutral conductor (N) or between the phase (L) and the protective conductor (PE);
   correcting a phase shift between the differential current $I_{LN}$ and the voltage (U-);
   determining several individual differential current values $I_{LN,i}$ and several individual voltage values $U_i$, wherein the differential current values $I_{LN,i}$ are phase-corrected with respect to the voltage values $U_i$;
   determining the effective power P from the several individual differential current values $I_{LN,i}$ and the several individual voltage values $U_i$;
   determining the effective voltage $U_{Eff}$ by means of the voltage values $U_i$; and
   determining the resistive component of the leakage current impedance ($R_{iso}$) by the effective voltage $U_{Eff}$ and the effective power P.

2. The method according to claim 1, wherein the alternating current network is a TN alternating current network.

3. The method of claim 1, wherein for adjusting a device for determining the resistive component of the leakage current impedance ($R_{iso}$), first a value for correcting the phase shift is determined by connecting said downstream branch having a purely capacitive load, a purely inductive load or a purely resistive load to the alternating current network, and then said voltage (U) and a differential current $I_{LN}$ are determined with said downstream branch.

4. The method of claim 1, wherein individual differential current scanning values are measured when measuring by scanning said differential current $I_{LN}$, individual voltage scanning values are measured when measuring by scanning said voltage (U), a temporal differential current curve is obtained from an interpolation of the differential current scanning values, and a temporal voltage curve is obtained from an interpolation of the voltage scanning values in order to improve the correction of the phase shift between the differential current $I_{LN}$ and the voltage (U).

5. The method of claim 4, wherein, when measuring by scanning the differential current $I_{LN}$, the differential current sensor includes a compensation conductor, and wherein an error of the differential current sensor is compensated by the compensation conductor.

6. The method of claim 5, wherein the current flowing through the compensation conductor is proportional to the current flowing through the phase (L) or the neutral conductor (N).

7. The method of claim 4, wherein an error of the differential current sensor is compensated by calculating a factor Kp from a measured variable current of the phase (L) and/or from a measured variable current of the neutral conductor (N), and wherein a value $Kp*I_{LN,i}$ is deducted for each measured differential current value $I_{LN,i}$.

8. The method of claim 1, wherein the alternating current network is switched off and/or a message is sent to a higher-level system if the resistive component of the leakage current impedance ($R_{iso}$) falls below a predetermined value.

9. A device adapted for determining the resistive component of the leakage current impedance (R) of a downstream branch to an alternating current network having a phase (L), a neutral conductor (N), and a protective conductor (PE) by a method according to claim 1, comprising:
   a voltage sensor adapted for measuring by scanning a voltage (U) between the phase (L) and the neutral conductor (N), or between the phase (L) and the protective conductor (PE),
   a differential current sensor adapted for measuring by scanning a differential current $I_{LN}$ between the phase (L) and the neutral conductor (N), and
   an evaluation unit adapted for correcting a phase shift between the differential current $I_{LN}$ and the voltage (U), adapted for determining several individual differential current values $I_{LN,i}$ and several individual voltage values $U_i$, wherein the differential current values $I_{LN,i}$ are phase-corrected with respect to the voltage values $U_i$, adapted for determining the effective power P from the several individual differential current values $I_{LN,i}$ and the several individual voltage values $U_i$, adapted for determining the effective voltage $U_{Eff}$ by the voltage values $U_i$, and adapted for determining the resistive component of the leakage current impedance ($R_{iso}$) by the effective voltage $U_{Eff}$ and the effective power P.

10. The device of claim 9, wherein the differential current sensor includes a core and a compensation conductor, and wherein the phase (L), the neutral conductor (N), and the compensation conductor are passed through the core.

11. A distribution cabinet, comprising at least one device of claim 9.

12. The distribution cabinet according to claim 11, wherein the device is designed as a terminal block.

13. The distribution cabinet of claim 11, wherein the distribution cabinet includes at least one additional device, and measured values of the device are exchanged with the at least one additional device.

14. The method of claim 2, wherein for adjusting a device for determining the resistive component of the leakage current impedance ($R_{iso}$), first a value for correcting the phase shift is determined by connecting said downstream branch having a purely capacitive load, a purely inductive load or a purely resistive load to the alternating current network, and then said voltage (U) and a differential current $I_{LN}$ are determined with said downstream branch.

15. The method of claim 14, wherein individual differential current scanning values are measured when measuring by scanning said differential current $I_{LN}$, individual voltage scanning values are measured when measuring by scanning said voltage (U), a temporal differential current curve is obtained from an interpolation of the differential current scanning values, and a temporal voltage curve is obtained from an interpolation of the voltage scanning values in order to improve the correction of the phase shift between the differential current $I_{LN}$ and the voltage (U).

* * * * *

UNITED STATES PATENT AND TRADEMARK OFFICE
CERTIFICATE OF CORRECTION

| | |
|---|---|
| PATENT NO. | : 11,965,916 B2 |
| APPLICATION NO. | : 17/769142 |
| DATED | : April 23, 2024 |
| INVENTOR(S) | : Simon Schulze, Wolfgang Schulze and Dimitar Vergov |

It is certified that error appears in the above-identified patent and that said Letters Patent is hereby corrected as shown below:

In the Specification

Column 5, Line 35, insert --$U_i$-- after values;

Column 5, Line 39, insert --$U_i$-- after values;

Column 5, Line 40, insert --$U_i$-- after values;

In the Claims

Column 11, Line 9, insert --(N)-- after conductor; and

Column 11, Line 18, delete "(U-)" and replace with (U).

Signed and Sealed this
Thirtieth Day of July, 2024

Katherine Kelly Vidal
*Director of the United States Patent and Trademark Office*